(12) United States Patent
Ittel et al.

(10) Patent No.: US 8,252,385 B2
(45) Date of Patent: Aug. 28, 2012

(54) SPIN-PRINTING OF ELECTRONIC AND DISPLAY COMPONENTS

(75) Inventors: Steven Dale Ittel, Wilmington, DE (US); Jennifer Leigh White, Wilmington, DE (US)

(73) Assignee: E I du Pont de Nemours and Company, Wilmington (DE)

( * ) Notice: Subject to any disclaimer, the term of this patent is extended or adjusted under 35 U.S.C. 154(b) by 1275 days.

(21) Appl. No.: 11/388,669

(22) Filed: Mar. 23, 2006

(65) Prior Publication Data
US 2007/0054104 A1 Mar. 8, 2007

Related U.S. Application Data

(60) Provisional application No. 60/665,107, filed on Mar. 25, 2005.

(51) Int. Cl.
*B05D 1/06* (2006.01)

(52) U.S. Cl. ......... 427/469; 427/126.4; 427/376.1; 427/384; 427/373; 427/519; 427/498; 427/457; 427/512; 427/125; 428/292.1; 428/357

(58) Field of Classification Search ............ 427/58, 427/469, 126.4, 376.1, 384, 373, 519, 498, 427/457, 512, 125; 428/292.1, 357
See application file for complete search history.

(56) References Cited

U.S. PATENT DOCUMENTS

| | | | |
|---|---|---|---|
| 2,936,482 A | 5/1960 | Kilian | |
| 2,989,798 A | 6/1961 | Bannerman | |
| 3,583,931 A | 6/1971 | Bouchard | |
| 4,059,949 A | 11/1977 | Lee | |
| 4,129,677 A | 12/1978 | Boe | |
| 4,211,681 A * | 7/1980 | Braun et al. ............ | 524/111 |
| 4,388,370 A | 6/1983 | Ellis et al. | |
| 4,755,587 A | 7/1988 | Rinehart | |
| 4,792,573 A | 12/1988 | Cohn | |
| 4,912,019 A | 3/1990 | Nebe et al. | |
| 4,925,771 A | 5/1990 | Nebe et al. | |
| 5,049,480 A | 9/1991 | Nebe et al. | |
| 5,391,432 A | 2/1995 | Mitchnick et al. | |
| 5,458,971 A | 10/1995 | Hernandez et al. | |
| 6,576,732 B1 | 6/2003 | Milligan et al. | |
| 7,618,704 B2 * | 11/2009 | Ittel et al. ............... | 428/323 |
| 2003/0110978 A1 | 6/2003 | Abe et al. | |
| 2004/0009290 A1 | 1/2004 | Carroll et al. | |
| 2004/0050476 A1 | 3/2004 | Hsu et al. | |
| 2005/0089679 A1 | 4/2005 | Ittel et al. | |
| 2005/0123688 A1 * | 6/2005 | Craighead et al. ........... | 427/469 |
| 2006/0084257 A1 * | 4/2006 | Tokita et al. ............... | 438/609 |

FOREIGN PATENT DOCUMENTS

| | | |
|---|---|---|
| EP | 0 250 664 B1 | 1/1988 |
| JP | 49034550 | 3/1974 |
| JP | 5716115 | 10/1982 |
| JP | 59047474 | 3/1984 |
| WO | 03/034150 A1 | 4/2003 |
| WO | 2005/023701 A2 | 3/2005 |

OTHER PUBLICATIONS

U.S. Appl. No. 60/665,098 filed Mar. 25, 2005, Steven D. Ittel et al.
Dresselhaus, The Wonderful World of Carbon, Springer Series in in Materials Science, 1998, vol. 33:9-29.
Jana et al., Wet Chemical Synthesis of Silver Nanorods and Nanowires of Controllable Aspect Ratio, Chemical Communications, 2001, vol. 7:617-618.
Gai et al., Surface Atomic Defect Structures and Growth of Gold Nanorods, Nano Letters, 2002, vol. 2:771-774.
Li et al., Isotropic-Liquid Crystalline Phase Diagram of a CdSe Nanorod Solution, J. Chem. Phys., 2004, vol. 120:1149-1152.
Chen et al., One-Step Wet Chemistry for Preparation of Magnetite Nanorods, Materials Letters, 2005, vol. 59:985-988.
Sun et al., Diamond Nanorods From Carbon Nanotubes, Advanced Materials, 2004, vol. 16:1849-1853.
Cao et al., Synthesis and Characterization of MgF2 and KMgF3 Nanorods, J. Of Solid State Chemistry, 2004, vol. 177:2205-2209.
Yu et al., A General Low-Temperature Route for Large-Scale Fabrication of Highly Oriented ZnO Nanorod/Nanotube Arrays, J. Am. Chem. Soc., 2005, vol. 127:2378-2379.
Aslan et al., Fast and Slow Deposition of Silver Nanorods on Planar Surfaces: Applications to Metal-Enhanced Fluorescence, J. Phys. Chem., 2005, vol. 109:3157-3162.
Mei et al., Synthesis and Optical Properties of Germanium Nanorod Array Fabricated on Porous Anodic Alumina and Si-Based Templates, Applied Physics Letters, 2005, vol. 86:1-3.
Liu et al., Potassium Titanate Arrays Grown on Titanium Substrates and Their in Vitro Bioactivity, J. Ceramic Soc., Japan, 2004, vol. 112:634-640.

* cited by examiner

*Primary Examiner* — Nadine G Norton
*Assistant Examiner* — Mahmoud Dahimene

(57) ABSTRACT

Processes for printing conductors, insulators, dielectrics, phosphors, emitters, and other elements containing elongated functional particles aligned along the axis of a spun fiber or film that can be for electronics and display applications are provided. Also provided are viscoelastic compositions used in the processes, and devices made therefrom.

21 Claims, 4 Drawing Sheets

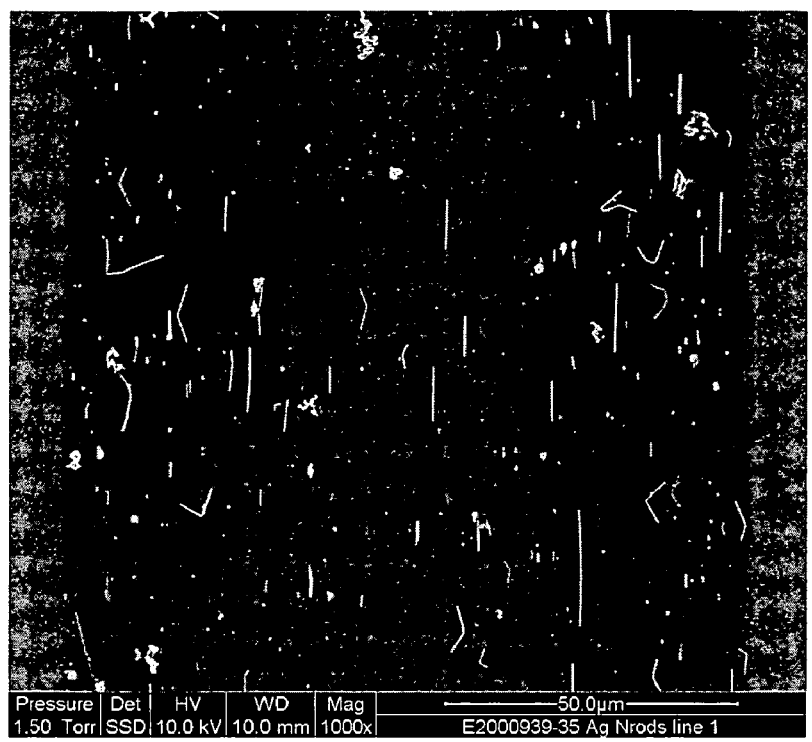
Figure 1 – Electron micrograph of dilute silver nanowires oriented by spin printing with substantial elongation of the fiber.

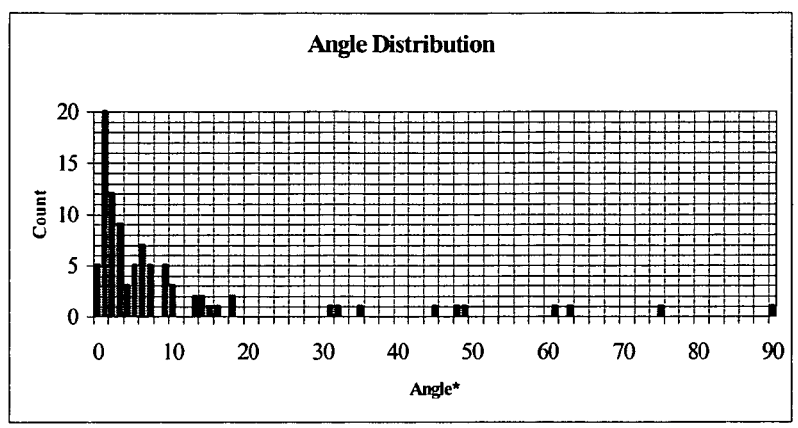
Figure 2 – Statistical analysis of the orientation of nanowires shown in Figure 1.

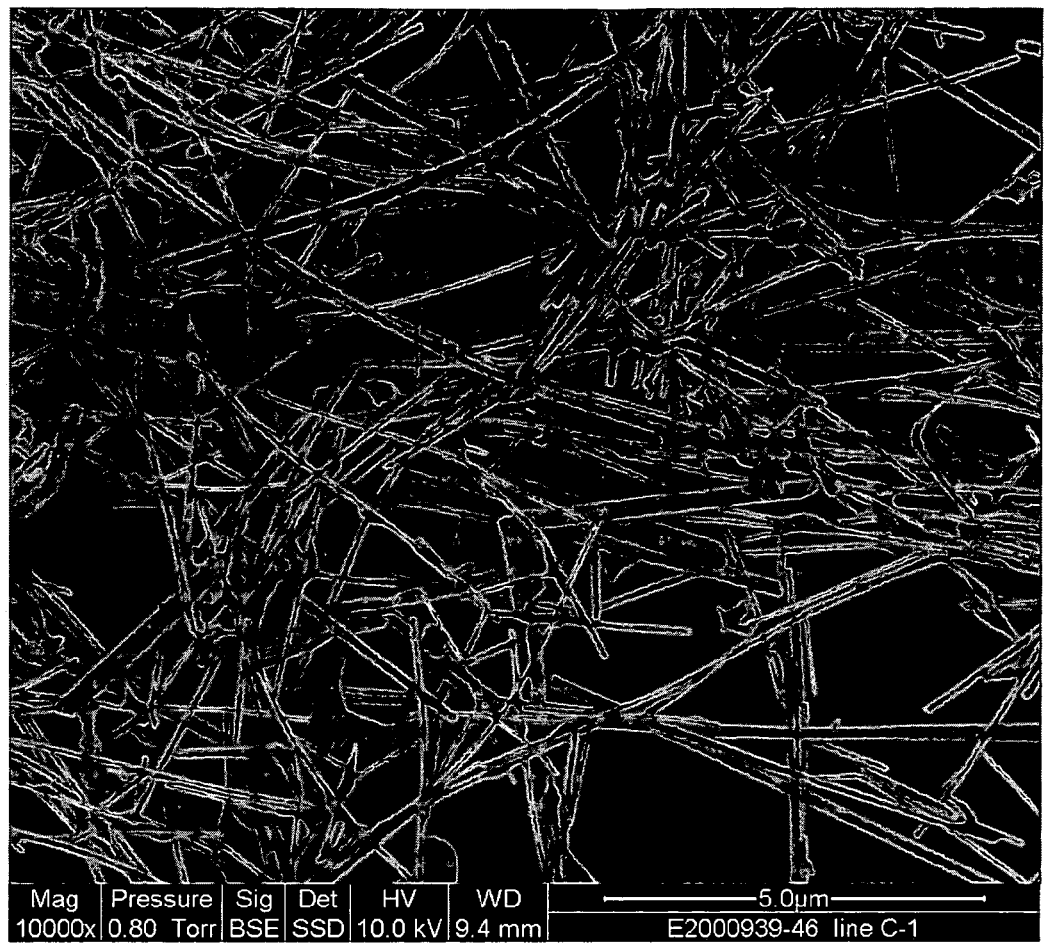
Figure 3 – Control electron micrograph of more concentrated silver nanowires in a spin printing fluid prior to elongation by spin printing.

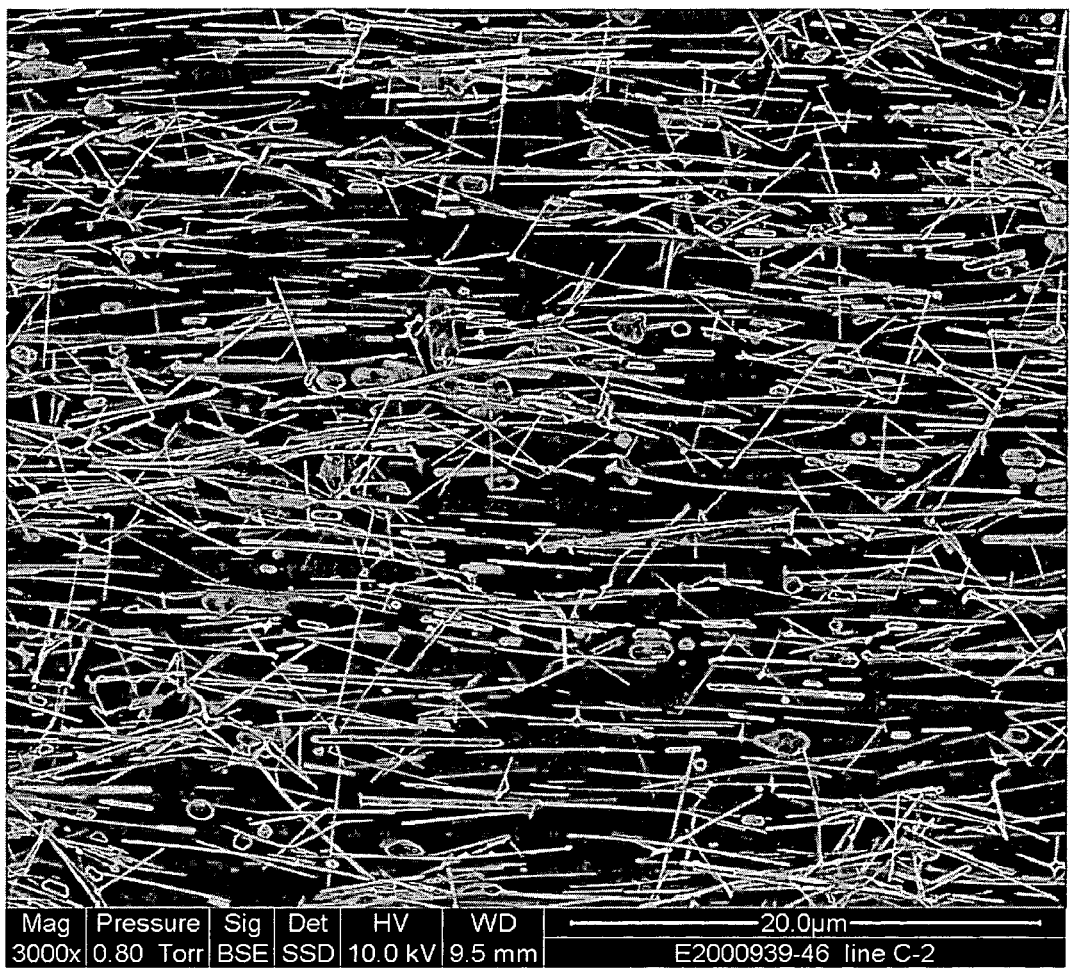
Figure 4 – Electron micrograph of more concentrated silver nanowires oriented by spin printing with substantial elongation of the fiber.

SPIN-PRINTING OF ELECTRONIC AND DISPLAY COMPONENTS

This application claims the benefit of U.S. Provisional Application No. 60/665,107, filed on Mar. 25, 2005.

FIELD OF THE INVENTION

The present invention is directed to a process for spin printing conductors, insulators, dielectrics, phosphors, emitters, and other elements containing elongated functional particles in patterns and images for electronics and display applications. The present invention also relates to compositions used in this printing process. The present invention further includes devices made therefrom.

TECHNICAL BACKGROUND

The electronics, display and energy industries rely on the formation of coatings and patterns of conductive and other electronically active materials to form circuits on organic and inorganic substrates. The primary methods for generating these patterns are screen printing for features larger than about 100 µm and thin film and etching methods for features smaller than about 100 µm. Other subtractive methods to attain fine feature sizes include the use of photo-patternable pastes and laser trimming.

It is the trend in the electronics industry to make smaller and less expensive electronic devices that provide higher resolution and enhanced display performance. As a result, it has become necessary to develop new materials and new approaches to manufacture such devices.

Photo-patterning technologies offer uniform finer lines and space resolution when compared to traditional screen-printing methods. A photo-patterning method, such as DuPont's FODEL@ printing system, utilizes a photoimageable organic medium as found in patents U.S. Pat. Nos. 4,912,019; 4,925,771; and 5,049,480, whereby the substrate is first completely covered (printed, sprayed, coated or laminated) with the photoimageable thick film composition and dried. An image of the circuit pattern is generated by exposure of the photoimageable thick film composition with actinic radiation through a photomask bearing a circuit pattern. Actinic radiation is radiation such as ultraviolet that can cause photochemical reactions. The exposed substrate is then developed. The unexposed portion of the circuit pattern is washed away leaving the photoimaged thick film composition on the substrate that, subsequently, is fired to remove all remaining organic materials and sinter inorganic materials. Such a photo-patterning method demonstrates line resolution of about 30 microns depending on the substrate smoothness, inorganic particle size distribution, exposure, and development variables. When employed for the production of conductors in display devices such as plasma display panels, field emission displays, or liquid crystal displays, the conducting lines can be up to a meter long, many orders of magnitude longer than their widths and precision. The process is necessarily subtractive in its nature as a result of the wash-out of a large portion of the pattern. A process that is additive is desired by those in the industry.

The ink jet printing system is a high resolution, additive printing system having the ability to print complex patterns through digital instructions. In the field of conductive inks, a liquid dispersion of ultrafine metal particles has been used in the formation of a conductive circuit making use of the ink jet printing system (US patent application 2003/0110978 A1). Liquid dispersions of other ultrafine particles such as metal oxides, organometallics or polymers can also be used in the formation of components of electronic circuits or display devices using ink jet printing systems. Ink jet techniques necessarily require low viscosity fluids for proper operation of the jetting system. It is difficult to build features to any appreciable thickness, though this can be done utilizing multiple passes. Drying time or some other means for stabilizing the initial feature is required between passes. Resolution is often compromised and it is difficult to obtain appreciable feature height to feature width because non-viscous, wetting fluids are employed. These systems are prone to clogging when employing inks with high solids content, particularly when the solid particles are not spherical.

United States patent application US 2004 (009290) discloses the spinning of conductive fibers or ribbons that are attached to a substrate by spinning a fiber or ribbon composed of an organic polymer with an inorganic material and affixing that fiber or ribbon in a desired orientation on a substrate and finally heating the composition to remove the organic polymer. This results in the conductive fiber or ribbon being affixed to the substrate in the desired orientation. Suitable inorganic materials are generally metal conductors that include Au, Ni, Au—Cr alloy, Au—Ta alloy, Cu—Cr alloy, Au/Indium tin oxide, Cu, Ag, and Ni. These constructions are useful as electrodes particularly on silicon wafers in solar cell fabrication. While several spinning methods are discussed, the concept of utilizing a viscoelastic system in which the concentration of the polymer component is no higher than a few percent is not disclosed. United States patent application US 2004050476 is similar but directed to a process for the fabrication of features on a display panel utilizing fibers or ribbons comprising organic polymers and inorganic material, the inorganic materials being phosphors, conductive metals or dielectric particles. These applications do not anticipate the advantage of using a viscoelastic polymer solution having a low polymer content thereby maximizing the quantity of functional phase materials printed onto the substrate.

It is possible to disperse solids in many synthetic polymers and spin fibers of those polymers. This is practiced with carbon blacks (U.S. Pat. Nos. 4,129,677, 4,388,370, and EP 250664), zinc oxide (U.S. Pat. No. 5,391,432), magnesium oxide (JP 57161115), or antimony tin oxide-coated Ti oxide particles (JP 59047474) in nylon for antistatic purpose, both throughout the fiber and in segregated into the core of core-shell compositions. Tin oxide (JP 49034550) has been added as a flame retardant. In all of these examples, the polymer component is an appreciable fraction and usually the majority of the mixture being spun. Conductivities of the resulting system are relatively low because the content of the active phase is necessarily so low. In addition, the fibers would have to be adhered to the substrate surface at very high temperatures for them to adhere. To achieve higher conductivities, the polymer fraction would have to be fired out, but the polymer content is so high that the volatilization process would destroy the lines.

An advantage of the composition disclosed herein is that the polymer content can be lower than the content of the functional phase and that it can be spun and adhered to the substrate surface at conditions close to ambient.

Despite the foregoing advances in such systems, manufacturers are continuously seeking compositions with improved utility of the ultrafine materials and finer resolution of lines and spaces. Such materials will increase the speed of the manufacturing processes without compromising high resolutions in the lines and spaces of the circuit or display patterns. The present invention is directed to such a process, the materials and compositions required for implementation of the process, and the methods for production of the materials.

SUMMARY OF THE INVENTION

One aspect of the present invention is a composition comprising:
  a) from 0.1 to 50 percent by weight of elongated functional particles,
  b) a dispersing vehicle, and
  c) from 0.1 to 8 percent by weight of an ultrahigh molecular weight polymer soluble in that dispersing vehicle, based upon the total weight of the composition.

In some embodiments, the composition comprises from about 0.5 to about 50 weight percent of the elongated functional particles. Optional additives can also be included in the composition.

The present invention further includes a process for creating an image on a substrate comprising:
  a) forcing a deposit composition comprising between 0.1 and 50 percent by weight based upon the total weight of the composition of elongated functional particles, a dispersing vehicle, and between 0.1 and 8 percent by weight of an ultrahigh molecular weight polymer soluble in the dispersing vehicle through an orifice to form a fiber;
  b) drawing the fiber to a draw ratio between 2 and 100;
  c) depositing the fiber onto a substrate; and
  d) evaporating the dispersing vehicle from the deposited fiber such that at least a portion of the functional particles becomes affixed to the substrate to form the image.

In some embodiments, the substrate having the particles deposited thereon can be heated to a temperature sufficient to remove the dispersing vehicle.

In some embodiments, the substrate having the particles deposited thereon can be heated to a temperature sufficient to remove the dispersing vehicle.

Another aspect of the present invention is a process for creating an image on a substrate comprising:
  a) depositing from a dispensing orifice a reservoir of a deposit composition comprising between 0.1 and 50 percent by weight of elongated functional particles based upon the total weight of the composition, a dispersing vehicle, and between 0.1 and 8 percent by weight of an ultrahigh molecular weight polymer soluble in that dispersing vehicle on the surface of a substrate such
  b) that the dispensing orifice and the substrate are simultaneously wet by the material in the reservoir;
  c) pulling a fiber from the reservoir by removing the dispensing orifice from the reservoir and away from the surface of the substrate translating the orifice to a location above a second point on the substrate at least 1 cm removed from the initial reservoir such that the fiber extends between the reservoir and the location above that second point;
  d) depositing that fiber between the reservoir and the second point on the substrate by contacting the dispensing orifice to the substrate at the second point;
  e) evaporating the dispersing vehicle from the deposited fiber resulting in the elongated functional particles being affixed to the substrate in the desired image; and
  f) optionally heating the substrate and deposited fiber to a temperature sufficient to effect removal of the dispersing vehicle and ultrahigh molecular weight polymer.

A further aspect of the invention is an ink set that comprises at least two compositions, the first composition comprising:
  from 0.1 to 50 percent by weight of a first group of elongated functional particles,
  a dispersing vehicle,
  from 0.1 to 8 percent by weight of an ultrahigh molecular weight polymer soluble in that dispersing vehicle, and
  optional adjuvants; and the second composition comprising:
  from 0 to 50 percent by weight of a second group of elongated functional particles different from the first group of elongated functional particles;
  a dispersing vehicle, and
  from 0.1 to 8 percent by weight of an ultrahigh molecular weight polymer soluble in that dispersing vehicle, and
  optional adjuvants
  Also provided are products produced by the processes disclosed herein. These and other aspects of the invention will be apparent to one skilled in the art in view of the following description and the appended claims.

BRIEF DESCRIPTION OF THE DRAWINGS

FIG. 1 shows an electron micrograph of dilute silver nanowires oriented by spin printing with substantial elongation of the fiber.

FIG. 2 details the statistical analysis of the orientation of nanowires shown in FIG. 1.

FIG. 3 is a control electron micrograph of silver nanowires (of greater concentration than those shown in FIG. 1) in a spin printing fluid prior to elongation by spin printing.

FIG. 4 shown an electron micrograph of silver nanowires (of greater concentration than those shown in FIG. 1) oriented by spin printing with substantial elongation of the fiber.

DETAILED DESCRIPTION

The compositions disclosed herein contain a relatively dilute, extensible solution of an ultrahigh molecular weight polymer. The compositions also contain a functional phase for an electronics or display application. The functional phase comprises particles that are elongated. By elongated, it is meant that the aspect ratio, which is the ratio between a first dimension of the particle and a second dimension substantially perpendicular to the first dimension and a third dimension, is 2 or greater. For convenience, the first dimension can be referred to herein as the "length", or the "major axis", and the second and third dimensions can be referred to herein as the "thickness", or the "minor axes". However, the use of such terms is not intended to convey that the particles must be cylindrical in shape. For example if the second and third dimensions are approximately equal the particle might be described as a needle, while if the second and third dimensions are substantially different, the particle might be described as a ribbon. Any elongated particles can be used. In the literature, the term acicular is often used to describe such particles and the terms wires, nanowires, rods, nanorods, needles and nanoneedles are gaining popularity.

When an amount, concentration, or other value or parameter is recited herein as either a range, preferred range or a list of upper preferable values and lower preferable values, the recited amount, concentration, or other value or parameter is intended to include all ranges formed from any pair of any upper range limit or preferred value and any lower range limit or preferred value, regardless of whether such ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

All percentages reported herein are by weight, unless otherwise stated. Any weight percentage recited for a component in a composition or combination of components is based on the total of all components, e.g., based on the total weight of the composition, unless otherwise stated.

The compositions can also contain other materials, such as additives, that aid in the composition of the composition, the printing of the composition, or the performance of the composition in end use applications. Lines of the functional phase are printed onto a substrate by a spin printing process, which includes forcing the composition through an orifice to form a continuous fiber that is stretched (drawn) while being laid down onto the substrate surface. The process of spin printing fibers containing elongated functional particles and accompanied by drawing of the spun fiber results in the orientation of the elongated particles with the long axis of the particles parallel to the axis of the fiber. The dispersing vehicle is evaporated to form a line. Other components in the composition can be burned out of the line.

Elongated functional particles for use in the processes disclosed herein can be, for example, carbon nanotubes, silver whiskers, titania rods, natural minerals such as attapulgite, sepiolite, certain elongated viral or other biological particles or metal-modified viral or other biological particles. It is found that elongated functional particles align their major axis with the axis of a spun fiber when the fiber is drawn. The composition containing the elongated particle and the ultrahigh molecular weight polymer is drawn from a spinneret to form a fiber that is then elongated by drawing to a length that is from about 10 times to about 100 times as long as the length of the fiber when it exits the orifice of the spinneret. The resulting elongated fiber is contacted with the substrate in an image wise manner resulting in the desired pattern. The orientation of the particles along the fiber axis results in their being oriented in the final image imparting desirable properties to the resulting printed image. If the particles are electrical conductors and printed as a conducting line, higher electrical conductivity in the resulting line can be obtained at lower particle loading as compared to spherical particles. This can result in a cost savings associated with the volume of the functional phase, particularly for relatively expensive functional phases such as carbon nanotubes.

Extrusion coating through a slot die is one of the basic methods of applying a liquid-based material to a substrate. Although the present specification discloses the use of flexible substrates, such as webs, the processes disclosed herein can be extended to the coating of rigid materials passing by on a production line. Most simply, a coating liquid is forced out from a reservoir through a slot by pressure, and transferred to a moving web. In practice, the slot is generally much smaller in cross-section than the reservoir, and is oriented perpendicular to the direction of web movement. Extrusion coating is generally recognized as using a die with a gap between the die and web, and the liquid is self supported as it travels from the die to the web. In the processes disclosed herein, the rate of web travel can be many times higher than the rate at which the material is extruded through the slot die. As a result, the film is drawn and oriented in the gap between the web and the die. A unique feature is that by employing the methods described herein, the concentration of active component particles coated onto the web or substrate can be much higher than the concentration of the polymer.

Virtually any linear ultrahigh molecular weight polymer soluble in a suitable solvent can be used in the processes disclosed herein, though some are more practical than others. The ultrahigh molecular weight polymer in solution imparts significant viscoelasticity to the solution, making the solution extensible even at very low concentrations of the polymer. Similar effects can be seen for more concentrated solutions of polymers, which are merely high but not ultrahigh molecular weight, but the high concentrations required put additional demands upon the system. In a polymeric fluid, which is viscoelastic, there are normal (elastic) forces generated during shear in addition to the viscous forces. Since normal-forces scale with weight average molecular weight (Mw) to the 7th power, versus viscous forces that scale to Mw to the 3.4 power, as the molecular weight of the polymer builds, the normal forces scale very quickly.

The term "ultrahigh molecular weight polymer", as used herein, means a polymer having a molecular weight of at least about 1,000,000. The ultrahigh molecular weight polymer can be a single homopolymer or copolymer or a mixture of homopolymers and/or copolymers. The polymer is desirably a linear or substantially linear polymer in which there are no more than two branches in the polymer chain that constitute a molecular weight of ten percent of the total molecular weight of the polymer. Methods for determining such dimensions are well known to those skilled in the art of polymer science.

Useful polymers for aqueous solutions include, but are not limited to poly(ethylene oxide), poly(acrylamide), xanthans and guar gum. Materials that are especially suitable for spin printing in an aqueous system appear to fall in certain specific categories. They are viscoelastic polymers having the following characteristics: a high polarity, water solubility, high molecular weight and a high hydrogen bond forming capability. Also, significantly they are very long or ultrahigh molecular weight, having a high linearity with few side branches and thereby an extremely large length to diameter ratio of the molecules. Solubility and high molecular weight are also important for effective dissolution of the ultrahigh molecular weight polymer in the water to achieve the desired properties. Some materials that can be used are guar gum, locust bean gum, carrageenan (Irish moss), gum karaya, hydroxyethyl cellulose, sodium carboxymethylcellulose, DAPS 10 [acrylamide-3-(2-acrylamido-2-methylpropyl) dimethylammonio)-1-propanesulfonate copolymer], polyethylene oxide, polyacryamide and polyvinylpyrrolidone. These materials are exemplary of substances exhibiting the above characteristics and thus work well in spin printing. Poly(ethylene oxide) and poly(acrylamide) are preferred polymers, and poly(ethylene oxide) is especially preferred. Included in the term poly(ethylene oxide) are both homo- and copolymers of ethylene oxide. Similarly, the term poly(acrylamide) is meant to include homopolymers of acrylamide as well as its copolymers with monomers such as acrylic acid or N-alkylacrylamides.

The concentration by weight of the polymer in the formulated composition is about 0.1-8%, preferably about 0.5-5%, and more preferably about 1-2%. The optimum concentration will depend on many factors such as the molecular weight of the polymer being used and its chemical structure. Generally speaking, the higher the molecular weight of the polymer, the lower the concentration that will be needed in the extensible viscoelastic solution. Some polymers for the extensible solutions, particularly natural polymers, can have some fraction that is insoluble in water. This insoluble fraction preferably is removed, as by filtration of the solution but care must be taken to avoid reduction of the molecular weight of the polymer in solution.

Useful polymers for hydrocarbon solutions include, but are not limited to poly(alpha-olefins) where the olefins contain eight or more carbon atoms. For example, polyoctene, polydecene, polydodecene, polytetradecene, polyhexadecene, polyoctadecene, polyeicosene, and higher, and copolymers of mixed alpha-olefins such as polyhexene/codecene, polypentene/cohexadecene, polyhexene/cooctenne/codecene, and related copolymers, have been produced using traditional Ziegler Natta catalysts. These polymers dissolved in hexane, octane, methylcyclohexane, decane, decaline, petroleum ethers, purified kerosenes, Exxon's Isopar® high purity isoparafinic solvents, or other hydrocarbon solvents are suitable non-aqueous systems for spin printing. They can be quite effective in use, but in practical terms, can suffer from the flammability of the solvent.

Poly(methyl methacrylate) (PMMA) and related acrylic polymers, when of sufficient molecular weight, are useful in solvents such as pyridine, butyl acetate, butyl cellosolve acetate; carbitol esters, such as butyl carbitol, butyl carbitol acetate and carbitol acetate, TEXANOL-B® (2,2,4-trimethyl-1,3-pentanediol monoisobutyrate) and other appropriate polar and generally, ester solvents. Poly(methyl methacrylate) is not particularly useful in for example, toluene. Poly(n-alkyl methacrylates) and n-alkyl acrylates can be useful polymers in hydrocarbon solvents when the alkyl branch on the ester group is of sufficient length to impart solubility in hydrocarbon solvents.

If polymers such as polyesters or nylons are to be employed, solvents such as hexafluoroisopropanol, phenol, catechols or formic acid must be employed. These solvents are toxic and noxious, limiting their applicability and thereby the applicability of the polymers they dissolve in spin printing. The ultra-high molecular weight PET utilized in the processes disclosed herein can be made utilizing the procedure described by Rinehart in U.S. Pat. No. 4,755,587 or the process described by Cohn in U.S. Pat. No. 4,792,573. In the spin printing process disclosed herein, a solution of PET in an appropriate organic solvent is prepared with the PET essentially homogeneously dispersed throughout the solvent. The organic solvents which can be utilized for PET are selected from (a) hexafluoroisopropanol, (b) trifluoroacetic acid, (c) mixed solvent systems containing hexafluoroisopropanol and dichloromethane, and (d) mixed solvent systems containing trifluoroacetic acid and dichloromethane. The mixed solvent systems of hexafluoroisopropanol and dichloromethane will typically contain from about 20 weight percent to about 99 weight percent hexafluoroisopropanol and from about 1 weight percent to about 80 weight percent dichloromethane. Such hexafluoroisopropanol/dichloromethane mixed solvent systems will preferably contain from about 30 weight percent to about 99 weight percent hexafluoroisopropanol and from about 1 weight percent to about 70 weight percent dichloromethane. The mixed solvent systems containing trifluoroacetic acid and dichloromethane will typically contain from about 20 weight percent to about 99 weight percent trifluoroacetic acid and from about 1 weight percent to about 80 weight percent dichloromethane.

The term "dispersing vehicle", as used herein, refers to fluids that are solvents or mixtures of solvents for the ultrahigh molecular weight polymer and will disperse the active component particles. Solvents can be pure chemicals or mixtures of chemicals. For example, it can be useful to combine water with an alcohol or glycol to modify the rate of evaporation of the overall solvent mixture. Similarly, butyl acetate solvent can be used in conjunction with 2,2,4-trimethyl-1,3-pentanediol monoisobutyrate to modify the rate of evaporation.

The terms "viscoelastic polymer solution" or "viscoelastic solution", as used herein refer to a solution of an ultrahigh molecular weight polymer exhibiting both viscous and elastic properties. A viscoelastic liquid will readily deform and flow under the influence of an applied shear stress. When the stress is removed the liquid will quickly recover from the last small portion of the deformation. Thus a small fiber quickly being drawn from a mass of the viscoelastic solution will remain straight while under tension, but will visibly sag immediately under the lesser force of the weight of gravity when the drawing tension is removed. For the purpose of the disclosures herein, any polymer solution having less than 10% concentration by weight of ultrahigh molecular weight polymer that can be extruded from a 125 µm orifice at a rate greater than 20 m/min and extended to greater than 40 m/min for 1 min or longer without breaking is considered a "viscoelastic polymer solution." Example 4 demonstrates tests of polymer solutions and the results of those tests.

The term "elongated functional particles" as used herein refers to materials that impart conductive, resistive, emissive, phosphorescent, barrier, insulator, or dielectric properties to the composition. The "elongated functional particles" can also impart UV or visible absorption to the composition or can act as photoactive species such as photocatalysts. The particle aspect ratio is preferably 2 or greater. Components of the composition are described herein below. The term "elongated functional particles" as used herein does not refer to materials designed to impart improved strength or stability to the ultrahigh molecular weight fraction of the composition.

The concentration by weight of the elongated functional particles in the formulated composition is about 0.1-50%, preferably about 0.5 to about −20%, and more preferably about 1- to about 10%. The optimum concentration will depend on many factors that include the density of the functional phase, the ability to disperse the material in the overall composition, the dimensions of the resulting desired images. The ability to disperse the material is dependent upon a variety of factors including the particle size of the material, the surface energy of the material, any surface treatments of the material, the efficacy of energy input in the dispersion process, to name a few.

In conductor applications the functional phase comprises electrically functional conductor particles. Electrical conductors are materials that contain movable charges of electricity. When an electric potential difference is impressed across separate points on a conductor, the mobile charges within the conductor are forced to move, and an electric current between those points appears in accordance with Ohm's law. While many conductors are metallic, there are many non-metallic conductors as well. The conductor particles of the disclosures herein will normally exhibit an appreciable fraction (e.g., more than about 10%) of the conductivity of their bulk form.

The electrically functional particles in a given composition can comprise a single type of particles, mixtures of particles, alloys, or compounds of two or more types of particles. Examples of such particles include: gold, silver, copper, nickel, aluminum, platinum, palladium, molybdenum, tungsten, tantalum, tin, indium, lanthanum, gadolinium, ruthenium, cobalt, titanium, yttrium; europium, gallium, zinc, silicon, magnesium, barium, cerium, strontium, lead, antimony, combinations or alloys thereof and other materials known to those skilled in the art of thick film compositions. Nonmetallic conductors include conductive carbon and organic polymers, copolymers, and conjugated polymers, such as poly(para-phenylene), polyaniline, and poly(p-phenylenevinylene). The non-metallic conductors generally have conductivities that are one or more orders of magnitude less than those of metals, but remain sufficiently conductive for many applications. Finally the elongated nanoparticles need not be of a single composition over the length of the particle. For example, nanorods consisting of alternating polar and non-polar segments such as those disclosed in WPO application WO 2005023701 can be used in the processes disclosed herein.

If conductivity is the desired property, it is not required that all of the particles be elongated. Elongated particles show conductivity at lower loadings than do spherical particles. However, much of the benefit of elongated particles will be obtained with a mixture of elongated and non-elongated particles.

In resistor compositions, the functional phase is generally a conductive oxide. Examples of the functional phase in resistor compositions are Pd/Ag and $RuO_2$. Other examples include ruthenium pyrochlore oxide, which is a multi-component compound of $Ru^{+4}$, $Ir^{+4}$ or a mixture of these (M'), the compound being expressed by the following general formula:

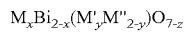

$$M_xBi_{2-x}(M'_yM''_{2-y})O_{7-z}$$

wherein: M is selected from yttrium, thallium, indium, cadmium, lead, copper and rare earth metals; M' is selected from platinum, titanium, chromium, rhodium and antimony; M" is ruthenium, iridium or a mixture thereof; x denotes 0 to 2 with a proviso that $x \leq 1$ for monovalent copper; y denotes 0 to 0.5 with the proviso that when M' is rhodium or two or more of platinum, titanium, chromium, rhodium and antimony, y stands for 0 to 1; and z denotes 0 to 1 with a proviso that when M is divalent lead or cadmium, z is at least equal to about x/2. These ruthenium pyrochlore oxides are described in detail in the specification of U.S. Pat. No. 3,583,931. The preferred ruthenium pyrochlore oxides are bismuth ruthenate ($Bi_2Ru_2O_7$) and lead ruthenate ($Pb_2Ru_2O_6$). There is a threshold loading required for any conductivity in these resistor compositions. The threshold is achieved at lower loadings of elongated particles than with spherical particles.

In dielectric compositions, the functional phase is generally a glass or ceramic. Dielectric thick film compositions are nonconducting compositions or insulator compositions that separate electrical charges and can result in the storage of an electrical charge. Therefore, the thick film dielectric compositions typically contain ceramic powders, oxide and non-oxide frits, crystallization initiator or inhibitor, surfactants, colorants, organic mediums, and other components common in the art of such thick film dielectric compositions. Examples of ceramic solids include: alumina, titanates, zirconates and stannates, $BaTiO_3$, $CaTiO_3$, $SrTiO_3$, $PbTiO_3$, $CaZrO_3$, $BaZrO_3$, $CaSnO_3$, $BaSnO_3$ and $Al_2O_3$, glass and glass-ceramic. It is also applicable to precursors of such materials, i.e., solid materials, which upon firing are converted to dielectric solids, and to mixtures thereof.

In barrier or insulator compositions, the functional phase is generally a glassy or ceramic metal oxide. Examples are powder of borosilicate lead glass, borosilicate zinc glass or borosilicate bismuth glass (i.e., $PbO-SiO_4$ glass, $PbO-B_2O_3-SiO_4$ glass, $ZnO-SiO_4$ glass, $ZnO-B_2O_3-SiO_4$ glass, $BiOSiO_4$ glass, and $BiO-B_2O_3-SiO_4$ glass); powdered oxides of Na, K, Mg, Ca, Ba, Ti, Zr, Al, etc., such as cobalt oxide, iron oxide, chromium oxide, nickel oxide, copper oxide, manganese oxide, neodymium oxide, vanadium oxide, cerium oxide, titanium dioxide (Tipaque Yellow), cadmium oxide, ruthenium oxide, silica, magnesia, and spinel. Air is the optimal low-dielectric material. Elongated particles printed in several directions will show higher insulating properties than spherical particles or insulator particles aligned in a single direction.

The inorganic, insulating or dielectric powder can be a mixture of particles different in physical properties. For example, a combined use of glass particles or ceramic particles having different thermal softening points is effective to control the shrinkage on baking. The shapes and the physical properties of inorganic powders are combined appropriately according to the characteristics required of the components such as barrier ribs, etc.

In emissive compositions, the functional field emitting phase can be single or multiple wall carbon nanotubes. Metal oxide electron-emitting material often contain a first component, M', selected from barium, strontium, calcium and mixtures thereof, and a second component, M", selected from tantalum, zirconium, niobium, titanium, hafnium and mixtures thereof, as metal element components and also contains oxynitride perovskite. The electron-emitting material can also contain $M'M''O_4N$ type crystals as the oxynitride perovskite wherein M' denotes the first component and M" denotes the second component. Preferably, the electron-emitting material satisfies the relationship: wherein X and Y are molar ratios of the first and second components to the total of the first and second components, respectively. In the electron-emitting material, the second component can be partially present in the form of a carbide or nitride or both. Preferably, the electron-emitting material further contains as an additional metal element component at least one element M which is selected from Mg, Sc, Y, La, V, Cr, Mo, W, Fe, Ni, and Al, more preferably in an amount of more than 0 mass % to 10 mass % calculated as oxide. The electron-emitting material can further contain at least one oxide selected from among $M'_4M''_2O_9$, $M'M''_2O_6$, $M'M''O_3$, $M'_5M''_4O_{15}$, $M'_7M''_6O_{22}$, and $M'_6M''M'''_4O_{18}$ type crystals wherein M' and M" are as defined above. The electron-emitting material preferably has a resistivity of $10^{-6}$ to $10^3$ ohm m at room temperature. The electrode is typically used as an electrode in a discharge lamp, electron gun, gas discharge panel, or field emission display.

Electroluminescent phosphor particles are useful in the manufacture of displays. They may be selected for example from $MGa_2S_4$, $ZnGa_2O_4$, $MGa_2O_4$, $Ga_2O_3$, $Ca_3Ga_2O_6$, and $Zn_2(Ge,Si)O_4$ (M=Ca and/or Sr), ZnS or M'S (M'=Ba, Ca, and/or Sr). Also included would be $Y_2O_2S$, ZnS, $ZnSiO_4$, or $Y_2SiO_5$.

The optical properties of aligned elongated particles show angular dependence. For example, particles that absorb light will do so for light polarized in alignment with the particles but will be transparent to light polarized at 90°. Elongated size-quantized materials or anisotropic quantum dots show quantum effects polarized by the alignment of the particles.

The electrically functional particles described above are finely dispersed in an organic medium and are optionally accompanied by inorganic binders. The term "inorganic binders" as used herein refers to materials that cause the functional phase materials to perform better in the end-use application. Inorganic binders frequently cause the functional material to bind more securely to the substrate. Alternatively, they can reduce the surface tension of the functional phase materials to improve continuity in the printed pattern. These may be metal oxides, ceramics, and fillers, such as other powders or solids. These materials may be identical in composition to some of the active components in other applications, but when used as a binder, they are generally present in lower concentrations in the overall composition. The function of an inorganic binder in a composition is binding the particles to one another and to the substrate after firing. Examples of inorganic binders include glass binders (frits), metal oxides and ceramics. Glass binders useful in the composition are conventional in the art. Some examples include borosilicate and aluminosilicate glasses. Examples further include combinations of oxides, such as: $B_2O_3$, $SiO_2$, $Al_2O_3$, CdO, CaO, BaO, ZnO, $SiO_2$, Na$_2$O, Li$_2$O, PbO, and ZrO which can be used independently or in combination to form glass binders. Typical metal oxides useful in thick film compositions are conventional in the art and can be, for example, ZnO, MgO, CoO, NiO, FeO, MnO and mixtures thereof.

The glass frits most preferably used are the borosilicate frits, such as lead borosilicate frit, bismuth, cadmium, barium, calcium, or other alkaline earth borosilicate frits. The preparation of such glass frits is well known and consists, for example, in melting together the constituents of the glass in the form of the oxides of the constituents and pouring such molten composition into water to form the frit. The batch ingredients can, of course, be any compounds that will yield the desired oxides under the usual conditions of frit production. For example, boric oxide will be obtained from boric acid, silicon dioxide will be produced from flint, barium oxide will be produced from barium carbonate, etc. The glass is preferably milled in a ball mill with water to reduce the particle size of the frit and to obtain a frit of substantially uniform size. It is then settled in water to separate fines and the supernatant fluid containing the fines is removed. Other methods of classification can be used as well.

The glasses are prepared by conventional glassmaking techniques, by mixing the desired components in the desired proportions and heating the mixture to form a melt. As is well known in the art, heating is conducted to a peak temperature and for a time such that the melt becomes entirely liquid and homogeneous. The glass transition temperature is in the range of 325 to 600° C.

It is preferred that at least 85% the inorganic binder particles be in the range of 0.1-10 μm and more preferably in the range of 0.2-2 μm. The reason for this is that smaller particles having a high surface area tend to adsorb the organic materials and thus impede clean decomposition. On the other hand, larger size particles tend to have poorer sintering characteristics. It is preferred that the weight ratio of inorganic binder to total solids be in the range 0.02 to 5 and more preferably in the range 0.1 to 2 and all ranges contained therein.

The binder materials may or may not be present in the formulations of other active components in compositions for resistive, emissive, phosphorescent, barrier, insulator, or dielectric applications.

Some or all of the solid-state inorganic binder or frit can be replaced with metal resinates and as used herein, the term inorganic binders is meant to include metal resinates. As used herein, the term "metal resinate" refers to organic metallic compounds which upon firing will be converted to inorganic oxides or glasses playing a role similar to the glass frit inorganic binders.

The "elongated functional particles" are preferably nanoparticles having an average minor axis of about 100 nanometers or less, such as from about 10 to 80 nanometers. Particularly preferred for compositions are nanoparticles having an average minor axis in the range of from about 20 to 50 nanometers. The long dimensions of such particles are determined by the aspect ratios, but very high aspect ratios can lead to materials that are difficult to disperse. Concentrations of particles can be limited by practical considerations such as the ability to maintain extrusion through a spinneret or die. Thus, aspect ratios of between 2 and 10 can be dispersed at the highest concentrations, but materials having aspect rations of up to 1000 and higher can still be employed, though probably at the lower end of the claimed ranges of composition. The ability to obtain suitable dispersions is a complex function of the size, of the particles, the aspect ratio of the particles, the rigidity of the particles, the surface properties of the particles and the dispersants and solvent systems employed.

Nanoparticles that are particularly preferred for use in the compositions and processes of the present disclosure are not substantially agglomerated.

It is known that micron-size particles and nanoparticles often form soft agglomerates as a result of their relatively high surface energies, as compared to larger particles. It is also known that such soft agglomerates can be dispersed easily by treatments such as exposure to ultrasound in a liquid medium, sieving, high shear mixing and 3-roll milling.

Examples of elongated nanoparticles are well known and are disclosed in literature. Carbon nanotubes are elongated particles (see Dresselhaus, Springer Series in Materials Science 1998, 33(Supercarbon), 9-29). Silver nanorods and nanowires are available synthetically (Jana, Gearheart, Murphy, Chemical Communications, 2001, (7), 617-618), as are gold nanorods (Gai, Harmer, Nano Letters 2002, 2(7), 771-774). Chalcogenide semiconductor materials such as CdSe are also available (Li, Marjanska, Park, Pines, Alivisatos, J. Chem. Phys. 2004, 120(3), 1149-52). Further examples include magnetite nanorods (Chen, Feng, Guo, Hong, Ding, Materials Letters 2005, 59(8-9), 985-988), diamond nanorods (Sun, Gong, Zhu, Zhu, He, Advanced Materials 2004, 16(20), 1849-1853), and MgF$_2$ and KMgF$_3$ nanorods (Cao, Wang, Qi, Guo, Hu, Journal of Solid State Chemistry 2004, 177(6), 2205-2209). Naturally occurring nanofiber materials include aluminosilicates such as asbestos.

There are several reports in the literature in which large arrays of nanorods have been prepared. Large arrays is a relative term meaning in their case, up to square millimeters or even centimeters while we disclose continuous methods suitable for square meters. These literature arrays are generally arduous tasks with the nanorods being prepared on the surface rather than being applied to the surface. See, for example, ZnO nanorod/nanotube arrays (Yu, Zhang, Han, Hao, Zhu, J. Am. Chem. Soc., 2005 ACS ASAP. CODEN: JACSAT ISSN: 0002-7863, AN 2005:89093 CAPLUS), silver nanorods on planar surfaces (Aslan, Leonenko, Lakowicz, Geddes, J. Phys. Chem., 2005 ACS ASAP. CODEN: JPCHAX ISSN: 0022-3654. AN 2005:71476 CAPLUS), germanium nanorod array on porous anodic alumina or Si-based templates (Mei, Li, Chu, Tang, Siu, Fu, Chu, Wu, Cheah, Applied Physics Letters 2005, 86(2), 021111/1-021111/3), or potassium titanate nanorod array on titanium (Liu, Tsuru, Hayakawa, Osaka, J. Ceramic Soc. Japan 2004, 112(December), 634-640).

As used herein, the term "dispersing vehicle" means a fluid that functions as a vehicle for dispersion of the functional particles of the composition in such form that it can readily be applied to a ceramic or other substrate. The solvent components of the dispersing vehicle are preferably inert (non-reactive) towards the other components of the composition. The dispersing vehicle is preferably a solvent for the ultrahigh molecular weight polymer. Thus, it is highly preferred that the dispersing vehicle be one in which the solids are dispersible with an adequate degree of stability. Secondly, the rheological properties of the organic medium are preferably such that they lend good application properties to the dispersion.

The solvent(s) preferably sufficiently high volatility to enable the solvent to be evaporated from the dispersion by the application of relatively low levels of heat at atmospheric pressure; however, the solvent is preferably not so volatile that the ink rapidly dries at normal room temperatures, during the spin-printing process. The preferred solvents for use in the compositions have boiling points at atmospheric pressure of less than 300° C. and preferably less than 250° C. For more polar polymer systems, such solvents include water, aliphatic alcohols, esters of such alcohols, for example, acetates and propionates; terpenes such as pine oil and alpha- or beta-terpineol, or mixtures thereof; ethylene glycol and esters thereof, such as ethylene glycol monobutyl ether and butyl cellosolve acetate; carbitol esters, such as butyl carbitol, butyl carbitol acetate and carbitol acetate and other appropriate solvents such as TEXANOL B® (2,2,4-trimethyl-3-pentanediol monoisobutyrate).

For non-polar polymer systems such as poly(alpha-olefins), the solvents will be non-polar, such as alkanes; examples of useful systems include hexane, cyclohexane, methylcyclohecanes, octane, decane, Isopar® alkanes, petroleum ethers, purified kerosenes, terpenes and long-chain alkylethers. Aromatic solvents generally do not work well with poly(alpha-olefins) unless high operating temperatures are employed or there is some aromatic content in the polymer (See, for example, U.S. Pat. No. 6,576,732). Solvents for crystalline polymer such as poly(ethylene terephthalate) or nylons will be highly polar hydrogen bonding solvents such as hexafluoroisopropanol, phenol, catechols, or formic acid.

As discussed above, solvents for use in the processes disclosed herein can be selected in tandem with the ultrahigh molecular weight polymer. Water is highly preferred because it is compatible with many polymers and it is non-flammable as opposed to the solvents for polyolefins. Water is commonly used in combination with a variety of hydrophilic organic molecules to modify the rate of evaporation, the wetting of the substrate, the compatibility with other additives and water as used herein is meant to imply systems in which the major component of the dispersing vehicle is water.

The ability to utilize mixtures of solvents provides considerable process advantages through operating latitude. Multiple solvents chosen to have specific evaporation or volatilization profiles can be critical in the development of uniform lines and edges, and in assuring adhesion of the printing ink to the substrate surface. In a preferred process of this disclosure, the primary solvent is water used in combination with other organic solvents having varied volatilities.

The vapor pressure of the organic molecules present in the dispersing vehicle is preferably sufficiently low that it does not rapidly evaporate from the paste at room temperature. This is to avoid reducing the "working life" of the spin printing ink. Additionally, if the vapor pressure is too high, it can vaporize during heat treatment too rapidly, which can produce an image containing excessive voids. The vapor pressure is preferably high enough to completely vaporize from the paste within a commercially practical time during heat treatment. The vapor pressure will therefore, at least in part, depend on the conditions of heat treatment.

As used herein, the term "adjuvants" refers to a variety of additives whose purpose is to improve the performance of the process or compositions. For example, polymeric dispersants and binders are commonly used in the polymers used in compositions and processes of this disclosure, and they are generally present in the composition at concentrations equal to or higher than those of the ultrahigh molecular weight polymers. As a result of their low molecular weight, in general, they contribute little to the viscoelastic properties of the composition. They play a role different than that of the ultrahigh molecular weight polymers in that they help in the dispersion of the inorganic phases in the medium and help maintain the suspensions once dispersion is achieved. Suitable solvents are compatible with the dispersing vehicle being employed and generally have a high affinity for or solubility in that solvent.

Water-based pigment dispersions are well known in the art, and have been used commercially for applying films such as paints or inks to various substrates. The pigment dispersion is generally stabilized by either a non-ionic or ionic technique. When using the non-ionic technique, the pigment particles are-stabilized by a polymer that has a water-soluble, hydrophilic section that extends into the water and provides entropic or steric stabilization. Representative polymers useful for this purpose include polyvinyl alcohol, cellulosics, ethylene oxide modified phenols, and ethylene oxide/propylene oxide polymers. In aqueous systems, homopolymers, random copolymers and block copolymers of vinylpyrrolidone are particularly useful. The non-ionic technique is not sensitive to pH changes or ionic contamination. In many applications, it has a major disadvantage in that the final product is water sensitive. Thus, if used in ink applications or the like, the pigment will tend to smear upon exposure to moisture. In many of the applications involving the printing of ultra-fine active components discussed herein, this water sensitivity is not an issue in that the organic components will be removed by firing leaving the ultrafine active component behind.

In the ionic technique, the pigments or ultrafine particles are stabilized by a polymer of an ion containing monomer, such as neutralized acrylic, maleic, or vinyl sulfonic acid. The polymer provides stabilization through a charged double layer mechanism whereby ionic repulsion hinders the particles from flocculating. Since the neutralizing component tends to evaporate after application, the polymer then has reduced water solubility and the final product is not water sensitive. Unfortunately, in most cases the ionic stabilizers will leave behind an inorganic residue of the counterion upon firing. In the case of ammonium, phosphonium or related ionic stabilizers, this residue can be mitigated. In certain circumstances, the counterions can even serve the role of inorganic binder. Thus it is a complex combination of variables that will influence the choice of dispersants.

The polymeric dispersants can also be binders after the solvent has evaporated, but binders may also be required, independently. There are two general classes of polymer binder that are commercially available polymers. They can be used independently or together in the compositions. First are binders made of copolymer, interpolymer or mixtures thereof made from (1) nonacidic comonomers comprising $C_{+10}$ alkyl methacrylate, $C_{1-10}$ alkyl acrylates, styrene, substituted styrene, or combinations thereof and (2) acidic comonomer comprising ethylenically unsaturated carboxylic acid containing moiety; the copolymer, interpolymer or mixture thereof having an acid content of at least 10 weight % of the total polymer weight; and having an average glass transition temperature (Tg) of 50-150° C. and weight average molecular weight in the range of 2,000-100,000 and all ranges contained therein.

The polymers formulated in the compositions and processes disclosed herein function to impart sufficient viscoelasticity for spinning and to suspend the other ingredients in the solvent so that they can be conveniently spun and applied to the substrate. Furthermore, the solvent diffuses from the paste and vaporizes during heat treatment to provide a substantially liquid-free, active components in combination with the polymeric components.

Both the ultrahigh molecular weight polymers and the adjuvant polymers act as "fugitive polymers" in most applications. It is preferred that the polymeric components are substantially reduced during firing or heat treatment in such a way as to provide a final image that is substantially free of voids and defects. The polymers act as "fugitive polymers" that will undergo 98-100% burnout under the firing conditions. The polymer is referred to as a "fugitive polymer" because the polymer material can be burned out of the functional components at elevated temperatures prior to fusing or sintering of the functional components on the substrate. As opposed to the solvent components that are simply volatilized, the polymeric components generally must undergo decomposition or oxidation to be removed. Thus, an important factor in the choice of both the ultrahigh molecular weight components and the dispersant component is their thermal behavior as indicated by thermogravimetric analysis. In general, it is desired that the polymers leave behind no carbonaceous residue, thus aromatic polymer systems are generally not preferred. For example, binder materials containing a significant proportion of aromatic hydrocarbons, such as phenolic resin materials, can leave graphitic carbon particles during firing which can require significantly higher temperatures to completely remove. It is also desirable that the polymeric components do not melt or otherwise become fluid during the firing process so that there is no degradation of the printed image.

At times, the printed compositions can be undesirably soft or malleable for some subsequent operating steps. Alternatively, they can soften or flow during early stages of the burnout process. It then becomes convenient to crosslink the polymers in place photochemically after printing. Additionally, it may be convenient to print more than the desired pattern, photopolymerize the bulk of the pattern and then wash off certain small portions. While this might be a less than 100% additive process, the flexibility gained may well offset the loss of a small portion of the active component.

The weight average molecular weight of the polymer binder is in the range of 2,000-100,000 and any ranges contained therein. The molecular weight of the polymer binder will depend on the application. Weights less than 10,000 are generally useful because they do not adversely affect the viscosity of the system. It is desired that the viscoelastic properties of the system be imparted mostly by the ultrahigh molecular weight polymer.

When the above composition is printed to form a dry image, it is preferable that the Tg (glass transition temperature) of the polymer binder is 50-150° C., and more preferably 50-100° C. The polymer is found in the composition in the range of 3-15 wt. % and any ranges contained therein based on total composition.

As used herein, the term "deposit composition" refers to a composition that has been or is to be deposited on the surface of a substrate. These terms and their application to the processes described herein are also defined in copending applications, U.S. Provisional Application No. 60/665098, filed on Mar. 25, 2005 and US2005-0089679, the disclosures of which are incorporated herein in their entirety.

As used herein, the term "reservoir" refers to a portion of deposit composition deposited upon the surface of the substrate from which fibers can be drawn as a result of the high viscoelasticity of the composition. The reservoir will generally be deposited through a fine-tipped spinneret or other device capable of deposition metered quantities of fluid on the surface. Fibers will then be drawn from that reservoir. Alternatively, the reservoir can be deposited on the surface of the substrate from a depositing orifice such as a spinneret and the drawing of a fiber from the reservoir can be accomplished with another finely pointed object such as a needle.

As used herein, the term "finely pointed object" is a spinneret or needle or other mechanical object capable of contacting a reservoir of deposit composition on the surface of a substrate. The finely pointed object is adhered to the deposit composition through any a variety of means. It can be wetted by the deposit composition. If the finely pointed object is a spinneret, the deposit composition may not wet the surface of the spinneret, but may selectively adhere to the deposit composition contained within the hollow cylinder of the spinneret. Finely pointed is meant to imply that the tip of the object is of dimensions equal to or smaller than the dimensions of the reservoir and in the order of the dimensions of the desired fiber to be drawn into a feature. It is observed that when the reservoir is touched by a needle that cannot supply additional deposit composition and then a fiber is drawn from that reservoir, the length of the resulting fiber is limited by several factors. The first is the quantity of material in the reservoir. Another is the amount of surface of the needle over which the deposit composition is adhered, thus controlling the diameter of the fiber that is drawn from the reservoir. The surface area of contact with the needle is controlled by the diameter of the needle, the curvature of the point of the needle and the depth to which the needle is penetrates the surface of the reservoir. Another factor is the ability of the deposit composition to wet the surface of the needle. The ability to wet the surface of the needle will once again control the diameter of the fiber that is initially drawn from the reservoir. The ability to wet the surface of the needle is a function of the materials included in the deposit composition and the materials of construction of the needle. Thus, the surface of a stainless steel needle might be unmodified or might be modified by silylation or with fluorocarbon materials to control the wetting interaction.

It is clear that the length of the fiber to be drawn would normally be limited by the amount of material contained in the reservoir on the surface of the substrate. When the finely pointed object is capable of delivering additional deposit composition during the drawing process, as in a spinneret, the line can be extended.

Generally, the spin printing process, by the nature of spinning and drawing fibers, is best suited to printing long, straight, very uniform lines on a flat substrate. The process of introducing physical contact of the spinneret with the substrate, thereby pinning the fiber to the substrate, allows the process to readily turn corners. Thus a right angle pattern could be printed by translating in the X direction over a substrate, touching the surface at a specified point and then translating in the Y direction.

Spin printing readily accommodates printing on flat surfaces. Convex surfaces are readily treated through three-dimensional movement of the spinneret with respect to the surface of the substrate. However, the process would not normally accommodate printing on concave surfaces because the linear drawing of the fiber would span gaps in the surface. The method of contacting the surface of the substrate to leave a reservoir at the point of contact facilitates the printing of concave three-dimensional surfaces.

Photoimaging capability can be imparted to the fibers. Photoimageable compositions are particularly useful to harden the deposited fiber when the fiber will not be fired. This is particularly important when the compositions and processes disclosed herein are used in conjunction with flexible, polymeric substrates that would not undergo a firing step. Conventional photohardenable methacrylate monomers can be used in the compositions disclosed herein as described in Glicksman and Santopietro, WO 03/034150 A1. Depending on the application, it is not always necessary to include a monomer in the composition when using the photocrosslinkable polymer. Suitable photoinitiation systems are those that generate free radicals upon exposure to actinic light at ambient temperature. A useful variety of such systems are described in Glicksman and Santopietro, WO 03/034150 A1.

Frequently the organic medium will also contain one or more plasticizers if additional image softness is desired. Such plasticizers help to assure good lamination to substrates and in photopolymerizable systems, enhance the developability of unexposed areas of the composition. However, the use of such materials is preferably minimized in order to reduce the amount of organic materials that must be removed when the images are fired. The choice of plasticizers is determined primarily by its compatibility with the chosen solvent and the polymer that must be modified. Solubility of the plasticizer in the primary solvent is not necessarily required as long as it remained well dispersed in the ink. Among the plasticizers, which have been used in various binder systems are diethyl phthalate, dibutyl phthalate, butyl benzyl phthalate, dibenzyl phthalate, alkyl phosphates, polyalkylene glycols, glycerol, poly(ethylene oxides), hydroxy ethylated alkyl phenol, tricresyl phosphate triethyleneglycol diacetate and polyester plasticizers.

A photospeed enhancer can added to the organic medium or directly added to the composition in those cases where some degree of photocuring is desired and are described in Glicksman and Santopietro, WO 03/034150 A1.

Additional components known to those skilled in the art may be present in the composition including dispersants, stabilizers, release, agents, dispersing agents, stripping agents, and antifoaming agents. A general disclosure of suitable materials is presented in U.S. Pat. No. 5,049,480.

The compositions and processes described herein can be applied to a wide variety of substrates. The types of substrates that are particularly useful include polyfluorinated compounds, polyimides, epoxies (including glass-filled epoxy), polycarbonates and many other polymers. Particularly useful substrates include cellulose-based materials such as wood or paper, acetate, polyester, polyethylene, polypropylene, polyvinyl chloride, acrylonitrile, butadiene (ABS), flexible fiber board, non-woven polymeric fabric, cloth, metallic foil, ceramics and glass. The substrate can be coated, for example a dielectric on a metallic foil or a metal on a ceramic or glass.

One difficulty in printing fine features is that the printed composition can wet the surface and rapidly spread to increase the width of the deposit, thereby negating the advantages of fine line printing. This is particularly true when printing is employed to deposit fine features such as interconnects or conductors for displays.

Spreading of the precursor composition is influenced by a number of factors. A drop of liquid placed onto a surface will either spread or not depending on the surface tensions of the liquid, the surface tension of the solid and the interfacial tension between the solid and the liquid. If the contact angle is greater than 90 degrees, the liquid is considered non-wetting and the liquid tends to bead or shrink away from the surface. For contact angles less than 90 degrees, the liquid can spread on the surface. For the liquid to completely wet, the contact angle must be zero. For spreading to occur, the surface tension of the liquid must be lower than the surface tension of the solid on which it resides.

The compositions can be confined on the substrate, thereby enabling the formation of features having a small minimum feature size, the minimum feature size being the smallest dimension in the x-y axis, such as the width of a conductive line. The composition can be confined to regions having a width of not greater than 100 µm, preferably not greater than 75 µm, more preferably not greater than 50 µm, and even more preferably not greater than 25 µm. The present disclosure provides compositions and methods of processing that advantageously reduce the spreading of the composition. For example, small amounts of rheology modifiers such as styrene allyl alcohol (SAA) and other polymers can be added to the precursor composition to reduce spreading. The spreading can also be controlled through combinations of nanoparticles and precursors. Spreading can also be controlled by rapidly drying the compositions during printing by irradiating the composition during deposition.

A preferred method is to pattern an otherwise wetting substrate with non-wetting enhancement agents that control the spreading. For example, this can be achieved by functionalizing the substrate surface with trialkylsilyl, hydrocarbyl or fluorocarbon groups.

Fabrication of conductor features with feature widths of not greater than 100 µm or features with minimum feature size of not greater than 100 µm from a composition requires the confinement of the low viscosity precursor compositions so that the composition does not spread over certain defined boundaries. Various methods can be used to confine the composition on a surface, including surface energy patterning by increasing or decreasing the hydrophobicity (surface energy) of the surface in selected regions corresponding to where it is desired to confine the precursor or eliminate the precursor. These can be classified as physical barriers, electrostatic and magnetic barriers, surface energy differences, and process related methods such as increasing the composition viscosity to reduce spreading, for example by freezing or drying the composition very rapidly once it strikes the surface.

In a preferred method, a reservoir of the spin printing composition is touched to the surface of the substrate to deposit a reservoir of material, which is then pulled as en elongated fiber from the surface and laid across the substrate to a new location. This is generally done through a dispensing orifice. For the purpose of this disclosure, a dispensing orifice is defined as a spinneret or other device through which the composition can be forced, but which included some mechanism for interrupting the flow of the printing composition. Thus if it were a simple spinneret, the pressure to the spinneret could be interrupted. Another mode would be to have a either an on/off valve or a diverting valve built into the device such that the flow could be controlled. In general, it is desired that both the inside and outside diameters of the dispensing orifice be relatively small so as to minimize smearing during the printing process. Typical inside diameters of spinnerets and dispensing orifices are between 10 and 350 micrometers.

For the purpose of this disclosure, a reservoir is defined as a spot of material deposited onto the surface of the substrate by the dispensing orifice without drawing but from which one or more fibers could be drawn in one or more directions. The purpose of the initial reservoir is to wet the surface of the substrate to provide a point of attachment to the substrate from which those one or more fibers could be drawn. If the fiber is to be drawn a short distance, the reservoir can contain all of the material required. If the point of attachment to the surface of the substrate is to be some distance from the initial reservoir, the dispensing orifice can be required to eject additional spin printing composition during the drawing process.

A preferred method is to simultaneously print two immiscible compositions, one containing elongated functional particles and the other without elongated functional particles side by side on a substrate in such a manner that the composition without elongated functional particles constrains the composition with elongated functional particles to a specific surface area. The miscibility of the two compositions is determined in part by the dispersing vehicle. It has been observed that for ultrahigh molecular weight polymers, the solvent for a given polymer is limited, so it is likely that both the dispersing vehicle and the ultrahigh molecular weight polymer would be different to achieve immiscibility. Alternatively, the two compositions can both contain elongated functional particles that are different. Such a procedure would result in one functional phase material being bound in position by the adjacency of the other.

A preferred method which is a variation of the immiscible composition approach is to print two miscible but differing compositions, one containing elongated functional particles and the other without elongated functional particles side by side on a substrate in such a manner that the composition without elongated functional particles constrains the composition with elongated functional particles to a specific surface area. The two dispersing vehicles in the two compositions my simply be miscible or they can be the same. While the miscibility of the two compositions would allow some mixing, the high solution viscosity of the ultrahigh molecular weight polymer causes the mixing or interpenetration of the two compositions to be minimal. As a result, diffusion of the elongated functional particles is minimal. Alternatively, the two compositions may both contain elongated functional particles that are different. Such a procedure would result in one functional phase material being bound in position by the other.

One embodiment of the disclosure provides a set of printing compositions designed to minimize the spreading of lines. The composition set comprises at least two compositions. The two dispersing vehicles and their respective ultrahigh molecular weight polymers can be chosen to be immiscible, thereby providing the maximum resistance to line spreading. Alternatively, the dispersing media can be miscible or can be the same, relying upon the high solution viscosity of the ultrahigh molecular weight polymer to minimize interpenetration of the two compositions.

Another example of a method for depositing the composition is to heat the composition relative to the temperature of the substrate to decrease the viscosity of the composition during printing. Generally the temperature difference between the composition and the substrate will be at least 10° C. before there is any noticeable effect of the heating. This can also have the advantage of volatilizing a portion of the dispersing vehicle before the composition reaches the substrate, thereby minimizing spreading of the line due to wetting of the surface. On the other hand, it is possible to volatilize the solvents too rapidly. Thus, it can be desirable to employ two or more solvents having significantly differing volatilities so that one is more quickly volatilized while another remains.

Another example of a method for depositing the composition is using a heated substrate to increase the rate of volatilization of the dispersing vehicle. If the composition contains reactive species, the heated surface can cause the immediate reaction, thereby crosslinking or otherwise modifying the printed pattern.

Another example of a method for depositing the composition is using a chilled substrate to quickly increase the viscosity of the printed pattern to minimize spreading of the lines.

Another example of a method for depositing the composition is to employ an array of many spinnerets. Thus, for example, to print 100 parallel conductive silver lines on glass for a display, a spinning head containing 100 spinnerets would be used. Consecutive sheets of glass would be transported continuously beneath the spinning head to print all 100 lines on each glass panel with no break in the silver-containing fiber. Alternatively, a single head could be transported repeatedly back and forth across a single sheet of glass printing all 100 lines consecutively.

Another example of a method for depositing the composition is to employ the method of creating a reservoir and pulling fibers from that reservoir. Generally, a fiber being stretched will be essentially linear from the point from which it originated to the point at which the drawing force is being applied. Thus, curved patterns are difficult. However, the act of "pinning" the fiber to the substrate surface by touching it to that surface such that it adheres. The act of pinning allows the direction of draw to be changed to create, for example, a right angle in the resulting image. This process can be repeated as many times as necessary to create the desired image. Taken to an extreme, the spinneret would be writing continuous curves on the surface of the substrate. In this case, there would be no draw of the fiber and the width of the resulting line would be determined by the diameter of the spinneret. Thus the resolution of the lines would be severely limited and it would be expected that orientation of the particles would be minimal.

After the printing process, the resulting conductive feature on the surface of a substrate can be post-treated after deposition and conversion of the metal precursor. For example, the crystallinity of the phases resent can be increased, such as by laser processing. The post-treatment can also include cleaning and/or encapsulation of the electronic features, or other modifications.

Another method for depositing the composition is using multi-pass deposition to build the thickness of the deposit. In one embodiment, the average thickness of the deposited feature is greater than about 0.1 µm and even more preferably is greater than about 0.5 µm. The thickness can even be greater than about 1 µm, such as greater than about 5 µm. These thicknesses can be obtained by deposition of discrete units of material by depositing more than a single layer. A single layer can be deposited and dried, followed by repetitions of this cycle. Sequential layers of material do not have to be taken through sequential drying processes; additional depositions can be carried out before the previous layer is completely dry. The use of multiple layers can be employed to build up substantial channels or vias on the surface of a substrate to physically confine the composition.

Channels on the surface of a substrate can be filled via the method of this disclosure. The channels being filled can have been created by any of a number of processes. In this physical barrier approach, a confining structure is formed that keeps the composition from spreading. These confining structures can be trenches and cavities of various shapes and depths below a flat or curved surface, which confine the flow of the precursor composition. Such trenches can be formed by chemical etching or by photochemical means. The physical structure confining the precursor can also be formed by mechanical means including embossing a pattern into a softened surface or mechanical milling, grinding or scratching features. Trenches can also be formed thermally, for example by locally melting a low melting point coating such as a wax coating. Alternatively, retaining barriers and patches can be deposited to confine the flow of composition within a certain region. For example, a photoresist layer can be spin coated on a polymer substrate. Photolithography can be used to form trenches and other patterns in this photoresist layer. These patterns can be used to retain precursor that is deposited onto these preformed patterns. After drying, the photolithographic mask may or may not be removed with the appropriate solvents without removing the deposited metal. Retaining barriers can also be deposited with direct write deposition approaches such as ink-jet printing or any other direct writing approach as disclosed herein.

It will be appreciated from the foregoing discussion that the process is best designed for the printing of straight lines on a substrate. A process of line spreading upon contact with the substrate has been described. The width of line features is also a function of the width of the fiber being deposited upon the surface. The width of the line is a function of the size of the spinneret, the pumping rate through the spinneret, and the draw ratio of the fiber after it has left the spinneret and before it has contacted the substrate surface. The draw ratio of the fiber is a function of the rate of translation of the spinneret relative to the surface of the substrate. Relative translation of the spinneret to the substrate can be accomplished by movement of either the substrate or the spinneret. The width of a line can be modulated by modification of width of the fiber before contact with the substrate. Thus the width of a line can be modulated by changing the spinning rate or by changing the rate of relative translation of the spinneret to the substrate.

The width of line features is also a function of the concentration of the dispersing vehicle at the moment of contact with the substrate surface. Thus, if there is evaporation of the dispersing vehicle from the fiber between the time that it exits the spinneret and the time that it contacts the surface of the substrate, wetting of the surface and spreading of the line will reduced. This is particularly true as the diameter if the drawn fiber is reduced, thereby increasing the relative surface area of the fiber from which evaporation can occur. On the rapid time frame of the imaging process, evaporation will occur primarily from the surface of the fiber rather than uniformly throughout. This further contributes to minimization of spreading on the substrate surface.

It will be appreciated from the foregoing discussion that two or more of the latter process steps (drying, heating, reacting and sintering) can be combined into a single process step.

When forcing the composition through the spinneret, a variety of methods can be employed. A positive displacement pump can be employed to maintain a constant flow rate. Syringe pumps are typically employed for this approach. Alternatively, the composition can be maintained at a constant positive pressure sufficient to force it through the spinneret at the desired rate.

The electronics, display and energy industries rely on a variety of printing methods for the formation of coatings and patterns of conductive and other electronically active materials to form circuits on organic and inorganic substrates. The primary methods for generating these patterns are screen printing for features larger than about 100 µm and thin film and etching methods for features smaller than about 100 µm. Ink jet technology is beginning to be developed for printing find conductive features on electronic systems. Subtractive methods to attain fine feature sizes include the use of photo-patternable pastes and laser trimming. Each of these printing techniques together with the spin printing technique described in this document has a signature set of characteristics that allow devices made by one particular technique to be differentiated from those made by the others. Those features are detected by optical microscopy, electron microscopy, profilometry, and electrical measurements. For example, photo-patternable pastes have relatively square shoulder features. Ink jetting results in relatively thin patterns or the presence of multiple passes can be detected microscopically. Laser trimming shows the effects of ablation along the sides of the features. Spin printing is characterized by good edge acuity and a rounded profile often thicker than can be achieved with ink jetting. These characteristics become apparent to one skilled in the art.

Typically, aqueous-based spin printing ink compositions are formulated to have a jelly- or paste-like consistency. Generally, the inks are prepared by mixing the organic vehicle that is a non-solvent for the ultrahigh molecular weight polymer that is added in powder form, monomer(s), ultrahigh molecular weight polymer and other organic components in a mixing vessel. This mixing is carried out under yellow light for photocurable systems. The ultrafine inorganic materials are then added to the mixture of organic components. The total composition is then mixed until the inorganic powders and ultrahigh molecular weight polymer is wetted by the organic materials. The mixture is then roll milled using a high-shear three-roll mill. The paste viscosity at this point could be adjusted with the appropriate vehicle or solvent to achieve a viscosity optimum for processing. Care is taken to avoid dirt contamination in the process of preparing paste compositions and in preparing parts, since such contamination can lead to defects. Finally, the water is added to the system, causing the ultrahigh molecular weight polymer to go into solution and achieving the desired jell-like consistency. The ink is then tumble-milled under low-shear conditions until it is thoroughly mixed.

Hydrocarbon-based systems are prepared similarly, but the ultrahigh molecular weight polymers are not available in convenient powder forms. Thus the milling will be done in the primary solvent used for the system rather than in a non-solvent for the ultrahigh molecular weight polymer. Small particles of the ultrahigh molecular weight polymer are added to the system and the mixture is further mixed in a rubber mill for a short period of time while the polymer begins to swell. Mixing is completed in a tumble mill.

The temperature of the spin printing process is not critical, but depends upon the nature of the solvent being employed. For aqueous systems a temperature range of about 0° C. to about 80° C., preferably 30° C. to 60° C. is convenient. Higher temperatures can result in greater evaporation of the dispersing vehicle during the printing process.

The printing process is relatively unaffected by environmental conditions, though the movement of air between the point the fiber is spun and the fiber is laid onto the substrate is preferably minimized.

Relative humidity affects the drying rate of the aqueous based systems and a lesser effect on the other solvent systems. This is generally reflected in the rate of drying of the polymer filament. If drying is too rapid, the fiber can be difficult to elongate prior to laying on the substrate. Drying too rapidly on the substrate can lead to distortions of the edge features of the lines. For these reasons, some control of relative humidity is preferred. It is also useful to utilize bi-component solvents to control the drying profile.

The substrates can be rigid or flexible. Generally, it is desired that the substrates not be highly absorbent and the surface of the substrate be clean, free from defects, and smooth.

Rigid substrates include, for example, glass, rigid crystalline or amorphous plastics, glass with various surface treatments, or various electrical components previously-printed onto a rigid substrate. Rigid substrates are useful in display devices such as plasma display panels, or liquid crystal displays. Substrates such as crystalline and amorphous silicon for solar energy devices can be printed using the techniques reported herein.

Flexible or semiflexible substrates are useful in a number of manners. The substrates include flexible plastics such as Mylar® poly(ethylene terephthalate), or other polyester films, Kapton® polyimide films, paper, surface-coated paper, polyethylene, polypropylene and biaxially-oriented polypropylene, or other natural and synthetic polymer systems. The printed flexible substrates can be or be incorporated into the final device. Alternatively, the image printed on the flexible substrate can be transferred onto the final device. Generally, patterns spin-printed onto flexible substrates cannot be fired at high temperatures due to the stability of the flexible substrate, but after transfer to or lamination on to rigid substrates, the system can be fired to achieve the final desired properties and to remove the flexible portion of the system.

The compositions can be processed by using a firing profile. Firing profiles are well within the knowledge of those skilled in the art of thick film technology. Removal of the organic medium and sintering of the inorganic materials is dependent on the firing profile. The profile will determine if the medium is substantially removed from the finished article and if the inorganic materials are substantially sintered in the finished article. The term "substantially" as used herein means at least 95% removal of the medium and sintering the inorganic materials to a point to provide at least adequate resistivity or conductivity or dielectric properties for the intended use or application.

When the image is being made onto a flexible medium for subsequent lamination, the spin-printed image can be protected by lamination with a coversheet before it is wound as a widestock roll. Silicone coated terephthalate PET film, polypropylene, or polyethylene can be used as a coversheet. The coversheet is removed before laminating to the final substrate.

Spin-printing is accomplished by spinning the viscoelastic polymer solution containing the functional phase and other components through a die or spinneret onto a substrate that is in motion relative to the spinneret. The solution-spun filament is made by forcing the organic solvent containing the polymer and other ingredients through the orifice of the die. The orifice of the die will typically be round, but can also be of other desired geometries. Dies have orifices of varied shape can be utilized to produce filaments having a wide variety of cross sectional designs, for example, round, square, rectangular, or elliptical. For example, a die having a rectangular orifice can be utilized to produce a filament that is essentially in the form of a ribbon or film. If the shape of the filament is other than round, the orientation of the die shape relative to the substrate can be adjusted as desired. For example, a ribbon or rectangular shape can be placed on the substrate either vertically or horizontally, as desired. It is generally convenient to utilize a die having an orifice that is essentially circular. The orifice of such dies will typically have a diameter that is within the range of about 20 to about 400 microns. In most cases, it is preferred for such orifices to have a diameter that is within the range of about 30 microns to about 200 microns.

Spinnerets that are equipped with multiple orifices can be used to print multiple lines in a single pass. Spacing of the multiple holes can be regular to provide a regular array of lines or spaced in a particular pattern to give a particularly desired array of lines. Dies with multiple holes do not necessarily need to be placed perpendicularly to the direction being printed. A diagonal placement will allow lines to be printed with spacing more narrow than the spacing of holes in the die. Holes in the die which are aligned parallel to the printing direction would allow multiple thicknesses to be printed in a single pass or to have two or more different compositions printed one atop another in a single pass.

The polymer solution containing the functional phase and other ingredients is forced through the die at a rate that is sufficient to attain a spinning speed of about 1 meter per minute to about 1000 meters per minute. Typically, the spinning speed is between about 2 meters per minute to about 400 meters per minute. It is generally desirable to utilize the fastest possible spinning speed that retains satisfactory uniformity. However, it can also be convenient to utilize slower spin-printing speeds to match the speed of the printing process with the speed of subsequent, down-stream steps in the manufacturing process. Higher spinning speeds are also desirable because they result in higher throughputs and better productivity. For this reason, spinning speeds in excess of 400 meters per minute would be desirable if uniformity and other desired properties can be maintained. It is expected that the lower spin-printing speeds will be utilized on rigid substrates where the machine direction is not parallel to the spinning direction.

The polymer solution is forced through the die or spinneret utilizing an adequate pressure to attain the spinning speed desired. The temperature of the process must be below the boiling point of the solvent. The polymer solution will typically be spin-printed at a temperature that is within the range of about 20° C. to about 70° C. when the solvent is water. The temperature will be determined by engineering of the process, the chosen solvent, its rate of evaporation, spinning speeds and other process variables. Temperatures above room temperature and controlled humidity conditions (primarily but not exclusively for aqueous-based systems) are desirable so that a uniform evaporation is easily maintained as atmospheric condition change. It is preferred that much of the solvent is removed from the polymer solution after passage through the die. Judicious choice of organic solvents would allow greater variation of the operating temperatures for the process.

As the solution-spun filament exits the spinneret, it can be subjected to a drawing procedure. For the purpose of the processes disclosed herein, draw or draw ratio is defined as the ratio of the printing speed to the speed at which the fiber initially exits the spinneret. The printing speed is the rate of relative motion between the printing spinneret and the substrate. Thus if the fiber is extruded from the spinneret at a rate of 1 m/min and the substrate is being translated at a speed of 10 m/min, then the draw ratio is 10. This elongation of the fiber is referred to as drawing.

During the drawing procedure the solution spun filament is drawn to a total draw ratio of at least about 1:1 to 100:1. The total draw ratio will typically be within the range of about 2:1 to about 20:1 for circular filaments. It is advantageous to utilize drawing to decrease line size, increase uniformity and possibly orient acicular active components. Drawing of non-circular filament shapes will be minimal because there is a tendency of all shapes to approach circular upon drawing.

For example, the components of barrier ribs for plasma display panels could be printed between rows of a fugitive polymer onto a flexible sheet. Shaped spinning is useful to establish the desired aspect ratio of rib height to width and the shape would be maintained by the fugitive polymer component. The two-component system could be transferred to a glass substrates in registration and the fugitive polymer channels would assure that the barrier ribs would retain their shape during the transfer and firing processes.

In certain exemplifications of the processes described herein, it is useful to print lines of different materials side-by-side, in contact with one another, in a manner that one printed inks confines the other ink to a specific location on the substrate. One of the two inks comprises the elongated functional particles while the other ink is different in that it may or may not contain elongated functional particles, may be a different solvent, may contain different functional particles, or may differ in some other way. In one mode of operation, one of the inks is a fully formulated ink containing elongated functional particles while the other ink contains only the ultrahigh molecular weight polymer for viscoelasticity, but none of the functional elongated particles. In another formulation one ink comprises the elongated functional particles while the other in comprises functional particles that are not elongated. The solvents of the inks are the components that most strongly miscibility of the two inks because they comprise the largest fraction of the inks. Thus, the two solvents can be chosen to maximize the immiscibility of the two inks, thereby using the two inks to confine one another to their specific printed areas and minimize spreading of the two components on the surface of the substrate.

The term "sheath-core" as used herein refers to fibers that consist of two components, one down the center core of the fiber and another that sheaths the inner component. By definition, the two components must be different in nature. In this application, the polymer components in the core and sheath can be the same or different. Most commonly, the active component in the core and sheath will be different. The sheath component need not contain any active component and in that case it would act largely as a spacer material to shield the core component during some particular step in the fabrication process. The preparation of sheath-core synthetic polymer fibers is well known in the art, as described by, e.g., Killian in U.S. Pat. No. 2,936,482, by Bannerman in U.S. Pat. No. 2,989,798, and by Lee in U.S. Pat. No. 4,059,949, and also in the art referenced herein above. A bicomponent spinning technique, which produces solid sheath-core bicomponent filaments of round cross-section is also known in the art and is described by Hernandez et al. in U.S. Pat. No. 5,458,971. It is preferably understood that known techniques for the production of sheath-core synthetic polymer fibers and of sheath-core bicomponent filaments as described above and in other prior publications can be used without departing from the spirit of the present invention.

The two spin printing ink components of sheath-core printing are subject to the same considerations as described above for the printing of two inks side-by-side. Thus the two ink components can be chosen to be immiscible, of similar compositions, or of dissimilar compositions for the same reasons described above.

EXAMPLES

This invention is illustrated by the following examples that are merely for the purpose of illustration and are not to be regarded as limiting the scope of the invention or the manner in which it can be practiced.

Example 1

Preparation of Silver Nanorods

Using a soft-template liquid-phase method, ethylene glycol (40 mL, Aldrich, Milwaukee, Wis.) was heated to 160° C. for 2 h in a 100 mL, 3-neck flask before simultaneously injecting a 0.1 M solution of silver nitrate (Aldrich, Milwaukee, Wis.) in ethylene glycol (20 mL) and a 0.2 M solution of poly(vinyl pyrrolidinone) (PVP, Mw=55000, Aldrich, Milwaukee, Wis.) in ethylene glycol (20 mL) at a rate of 0.2 mL/min. Upon addition of both solutions, a yellow color appeared that gradually changed to an iridescent, yellow-gray suspension. After addition was complete, the suspension was heated at 160 C for 1 h. The reaction was allowed to cool to room temperature and the supernatant was decanted leaving a fluffy, gray solid, which was washed several times with deionized water.

Example 2

Alignment of Silver Nanorods

To the silver nanorods dispersed in a minimal amount of water in a 20 mL vial was added poly(acrylamide) (20 mg, Mw=18,000,000, Polysciences, Inc., Warrington, Pa.), and the suspension was vortexed on a mini vortexer (VWR, West Chester, Pa.) for several minutes before rolling overnight on a U.S. Stoneware (East Palestine, Ohio) roll mill. The vial was vortexed again for several minutes. A drop of the suspension was placed on a silica wafer using a pipette. A fiber was then quickly drawn from the drop with the pipette tip and was laid across the silica wafer in a single rapid motion.

Example 3

Electron Microscopy

Samples were prepared for scanning electron microscope (SEM) imaging by placing one drop of the as received solution on to a carbon filmed copper grid and allowing the liquid to dry. The resulting samples were then imaged in the Hitachi S-5000SPX High Resolution SEM (Hitachi High Technologies America, Inc., 5100 Franklin Drive, Pleasanton, Calif. 94588) at various magnifications using the standard height specimen holder, with 5 Kv accelerating voltage. FIG. 1 is the resulting electron micrograph.

Example 4

Image Analysis Procedure for Metal Nanorods in Polymer

The SEM (Scanning Electron Microscopy) image was saved as a JPG file. The software employed for image analysis was Khoros 2000 (Khoros Pro 2000 Visual Prototyping Environment is now available from AccuSoft as VisiQuest, AccuSoft Corporation, 71 Lyman Street, Northborough, Mass. 01532). All the particles (chunks, rods and their aggregates) in the image were initially segmented digitally. A particle orientation measurement was then applied to each particle. Taking the north (stretching direction) as orientation angle=0, the orientation of all the particles were measured between values from −90 to +90° (±90° would be for particles that are perfectly perpendicular to the stretching direction). The absolute values of the angles were considered when calculating the distribution in the graph. An aspect ratio (length/width) was also calculated for all particles. Any particles with aspect ratio≦2 were considered to be non-rod particles and were rejected from the orientation distribution. FIG. 2 includes the resulting distribution of particle orientations of the sample shown in FIG. 1. A random distribution of particles would be equally populated from 0 to 90° with a mean of 45°. The distribution is clearly oriented in the machine direction and the mean angle is only 10°.

Control Example 1

As a control, the same sample of silver nanorods was dispersed in the same medium but at a higher concentration as evidenced by the darker color of the suspension. A drop of the suspension was then placed on the silica wafer. The sample was not drawn. The distribution of particles was too complex for the software to handle, but it is clear from FIG. 3 that there is little order beyond the entanglement of the silver nanorods. There is no orientation.

Example 5

Alignment at Higher Concentrations

The suspension of silver nanorods from control example 1 was subject to elongation by drawing on the silica wafer. The distribution of particles was too complex for the software to handle, but it is clear in FIG. 4 that there is a high degree of order and that the entanglement of the silver nanorods has been diminished.

Example 6

Mechanized Spin Printing

A CS-194T BioDot XYZ Dispense Platform from Cartesian Technologies (Genomic Solutions, Inc., Ann Arbor, Mich.) was modified for spin printing. The BioDot programming allowed for the use of multiple onboard syringe pumps coordinated with the moveable stage. As the table speed was not as fast as desired, the onboard syringe pumps were manipulated to retain a proper spinning ratio.

The BioDot XYZ Dispense Platform utilizes a variable speed 250 μL syringe pump correlated to a moveable platform of maximum speed ca. 2.6 m/min. Custom-made spin jet heads were cut to length from ART[10] Molecular BioProducts pipette tips #2139 (VWR Scientific, West Chester, Pa.) with an exit internal diameter of about 45 μm. These jet heads are the equivalent to spinnerets in traditional fiber spinning. Using the BioDot AxSys software, a program was developed to draw 4 parallel lines at 53 mm lengths. These lines were drawn on an $O_2$ plasma cleaned 77 mm long glass slide with <2 mm thickness. Each line was drawn <1 mm from the surface of the slide as to minimize any drawing effects due to gravity.

The suspension of silver nanorods prepared in Example 2 was manually filled into the syringe, because the solution was too viscous to be filled under the suction of the pump. The syringe pump exhibited no problems in pushing this solution through the jet.

The technique used in spin printing was to first place the jet directly on the surface of the substrate. This creates a starting point to which the filament was anchored. Then the jet is withdrawn from the surface by a distance of 1.0 mm. As the table moved horizontally in a straight line in the x-direction at constant speed, an elongated filament was created and gravity pulled it to the surface of the substrate. When the first line was complete, the process began again in the reverse direction after shifting a known distance in the y-direction to achieve a series of parallel lines.

Inspection of the lines by optical microscopy clearly demonstrated that the printed line-width was 50 to 125 μm after the solvent had wet the glass surface. The Ag nano-rods were aligned parallel to the spinning direction. This was subsequently confirmed by Scanning Electron Microscopy (SEM).

Example 7

Printing Attapulgite—a Complex Metal Oxide

Attapulgite is a safe, naturally occurring, acicular, complex magnesium aluminosilicate of the composition $(Mg,Al)_2Si_4O_{10}(OH).4H_2O$. It has a three-dimensional chain structure that gives it unique colloidal and sorptive properties and as a result, it is commonly found in antidiarrheal medications, cat litter and oilfield products.

Attapulgite clay (35 mg, dehydrated aluminum-magnesium silicate nanorods, Engelhard, Iselin, N.J.), was added to a 20 mL vial together with dodecyl sulfate sodium salt (75 mg, Aldrich, Milwaukee, Wis.), and distilled water (5 mL). The resulting suspension was sonicated using a Branson 450 Sonifier (VWR Scientific, West Chester, Pa.); duty cycle=constant, output control ~4 for approximately one hour. A 2% aqueous solution of poly(acrylamide) (~5 g, 18 million MW, Aldrich, Milwaukee, Wis.) was added to the sonicated, tan dispersion. The resulting suspension was rolled overnight on a U.S. Stoneware (East Palestine, Ohio) roll mill.

A glass pipette was used to place a drop of the viscoelastic dispersion onto a dry carbon painted nickel sample holder designed specifically for facile electron microscopy, and a fiber was then quickly drawn from the drop with the pipette tip across the substrate in a single rapid motion. The resulting printed line was investigated by electron microscopy as in Example 3. Contrast between the organic spinning matrix and the attapulgite crystals was not high enough for automated identification and counting, but the particles could be clearly identified.

The alignments of 50 particles were measured. The particles were found to be highly aligned in the spinning direction with a standard deviation of 8.41 degrees. It was observed that the deviation was considerably lower for the longest particles as might be expected.

Example 8

Printing Sepiolite (Pangel® B5)

To a 20 mL vial was added PANGEL® B5 (20 mg, organically modified hydrated magnesium silicate, $Mg_4Si_6O_{15}(OH)_2.6(H_2O)$, from Tolsa S. A., Madrid, Spain), dodecyl sulfate sodium salt. (35 mg, Aldrich, Milwaukee, Wis.), and distilled water (10 mL). This was sonicated using a Branson 450 Sonifier (VWR Scientific, West Chester, Pa.); duty cycle=constant, output control ~3 for approximately one hour. A pH 10.00 buffer solution (VWR Scientific, West Chester, Pa.) was added dropwise until the dispersion reached pH 8 as determined by pH paper. The basic dispersion (1 mL) was added to a 2% aqueous solution of poly(acrylamide) (~5 g, 18 million MW, Aldrich, Milwaukee, Wis.) and rolled overnight on a U.S. Stoneware (East Palestine, Ohio) roll mill. A glass-tipped dispenser was used to elongate a fiber of the viscoelastic dispersion over a dry, spectroscopically-pure, carbon-painted nickel plate in a single rapid motion. The sample was then imaged with an electron microscope. In the portions of the sample where dispersion had been good, achieving isolated sepiolite particles, there was a high degree of orientation. In a micrograph showing good particle dispersion and a sufficient number of particles to get good statistics, the mean angle of deviation from the draw direction was 0° with a standard deviation of 20.4°, for particles having a mean length of 0.30 microns with a standard deviation of 0.22 microns. Longer particles showed a higher degree of orientation. When the data were selected for those particles having a length greater than 0.30 microns (those above the mean) the deviation dropped to 6.4°. When the data were selected for those particles having a length greater than 0.50 icrons (the mean plus one standard deviation) the deviation on the alignment dropped to 3.3°.

What is claimed is:
1. A process comprising:
    (a) forcing a deposit composition through an orifice to form a fiber, wherein the composition comprises from 0.1 to 50 percent by weight of elongated functional particles based upon the total weight of the composition, a dispersing vehicle, and from 0.1 to 8 percent by weight of a polymer having a molecular weight of at least about 1,000,000 that is soluble in that dispersing vehicle;
    (b) drawing the fiber to a draw ratio from 2 to 100; and

(c) depositing the fiber on a substrate; evaporating the dispersing vehicle from the deposited fiber resulting in the elongated functional particles affixed to the substrate in a desired image.

2. A process comprising:
(a) depositing on the surface of a substrate, from a dispensing orifice, a reservoir of a deposit composition comprising from 0.1 to 50 percent by weight of elongated functional particles based upon the total weight of the composition, a dispersing vehicle, and from 0.1 to 8 percent by weight of a polymer having a molecular weight of at least about 1,000,000 that is soluble in that dispersing vehicle such that the dispensing orifice and the substrate are simultaneously wet by the material in the reservoir;
(b) pulling a fiber from the reservoir by removing the dispensing orifice from the reservoir and away from the surface of the substrate translating the orifice to a location above a second point on the substrate at least 1 cm removed from the initial reservoir such that the fiber extends between the reservoir and the location above that second point;
(c) depositing that fiber between the reservoir and the second point on the substrate by contacting the dispensing orifice to the substrate at the second point; and
(d) evaporating the dispersing vehicle from the deposited fiber resulting in the elongated functional particles being affixed to the substrate in a desired image.

3. The process of claim 1 or claim 2 wherein a) and b) are carried out continuously.

4. The process of claim 1 or claim 2 wherein the fiber is a sheath/core fiber.

5. The process of claim 4 wherein the sheath consists of a fugitive polymer.

6. The process of claim 4 wherein the polymer content of the sheath is higher than that of the core.

7. The process of claim 4 wherein the sheath comprises a polymer containing an insulating component and the core comprises a polymer containing a conductive component, and wherein the insulating component contains encapsulated conductors on the substrate after firing.

8. The process of claim 1 or claim 2 in which two or more sequential layers of the printing composition are printed onto the substrate adjacent to and contacting each other.

9. The process of claim 1 or claim 2 in which two or more sequential layers of the printing composition are printed onto the substrate and in which the two or more layers contain different active components, different adjuvants or different active components and adjuvants.

10. The process of claim 1 or claim 2 wherein the surface of the substrate has been chemically modified to have a surface energy different than that of the natural surface energy of the substrate to make it more non-wetting to minimize spreading of the deposit composition.

11. The process of claim 10, further comprising modifying a first portion of the substrate to have a surface energy that is different than the surface energy on a second portion of the substrate, and wherein the first portion is adapted to confine the deposited composition.

12. The process of claim 10, further comprising modifying a first portion of the substrate, wherein the first portion is adapted to confine the deposited composition.

13. The process of claim 1 or claim 2 wherein the temperature of the deposit composition is higher than the temperature of the surface of the substrate.

14. The process of claim 1 or claim 2 wherein the temperature of the deposit composition is lower than the temperature of the surface of the substrate.

15. The process of claim 1 or claim 2 wherein the substrate comprises one or more channels and the deposit composition is deposited into one or more channels on the substrate.

16. The process of claim 1 or claim 2 wherein the substrate is rigid.

17. The process of claim 1 or claim 2 wherein the substrate is selected from glass, ceramics and polymers.

18. The process of claim 17 wherein the substrate is a semiconductor.

19. The process of claim 1 or claim 2 wherein the substrate is flexible.

20. The process of claim 1 or claim 2 wherein the fiber from the orifice is touched to the substrate to establish adhesion between the fiber and the substrate.

21. The process of claim 1 or claim 2 wherein the width of the image is modulated by modulating the draw ratio of the fiber.

* * * * *